United States Patent
Bar-Joshua et al.

(10) Patent No.: US 10,565,102 B2
(45) Date of Patent: Feb. 18, 2020

(54) UPDATING CACHE USING TWO BLOOM FILTERS

(71) Applicant: International Business Machines Corporation, Armonk, NY (US)

(72) Inventors: Michael Bar-Joshua, Haifa (IL); Yiftach Benjamini, Haifa (IL); Bartholomew Blaner, Shelburne, VT (US); Michael Grubman, Kiryat Ata (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/653,776

(22) Filed: Jul. 19, 2017

(65) Prior Publication Data
US 2019/0026218 A1  Jan. 24, 2019

(51) Int. Cl.
*G06F 12/0864* (2016.01)
*G06F 12/02* (2006.01)
*G11C 11/56* (2006.01)
*G06F 16/22* (2019.01)
*G06F 1/3234* (2019.01)
*G06F 11/07* (2006.01)
*G06F 12/0802* (2016.01)
*G06F 16/13* (2019.01)

(52) U.S. Cl.
CPC ........ *G06F 12/0246* (2013.01); *G06F 1/3275* (2013.01); *G06F 11/073* (2013.01); *G06F 12/0864* (2013.01); *G06F 16/22* (2019.01); *G11C 11/5642* (2013.01); *G06F 12/0802* (2013.01); *G06F 16/134* (2019.01); *G06F 2212/225* (2013.01)

(58) Field of Classification Search
CPC ........... G06F 17/3033; G06F 17/30628; G06F 17/30; G06F 7/00; G06F 1/3275; G06F 11/073; G06F 17/30949; G06F 12/0864; G06F 12/1018; H04N 21/23106
See application file for complete search history.

(56) References Cited

U.S. PATENT DOCUMENTS

| | | | |
|---|---|---|---|
| 7,548,908 | B2 | 6/2009 | Fu et al. |
| 7,937,535 | B2 | 5/2011 | Özer et al. |

(Continued)

OTHER PUBLICATIONS

Bar-Joshua et al., "Updating Cache Using Two Bloom Filters", U.S. Appl. No. 15/889,521, filed Feb. 6, 2018.

(Continued)

*Primary Examiner* — Hoai V Ho
*Assistant Examiner* — Jay W. Radke
(74) *Attorney, Agent, or Firm* — Andrew Aubert; Stephen Yoder (57) ABSTRACT

Updating cache devices includes a processor to detect a first set of hash functions and a first bit array corresponding to elements of a cache. In some examples, the processor detects a first instruction to add a new element to the cache and modify the first bit array based on the new element. Additionally, the processor processes a first invalidation operation and generates a second bit array and a second set of hash functions, while processing additional instructions. The processor deletes the first bit array and the first set of hash functions in response to detecting that the second bit array and the second set of hash functions have each been generated. Some examples process a second invalidation operation with the second set of hash functions and the second bit array.

16 Claims, 5 Drawing Sheets

(56) References Cited

U.S. PATENT DOCUMENTS

| | | | |
|---|---|---|---|
| 9,361,327 | B1 | 6/2016 | Chen et al. |
| 10,003,574 | B1* | 6/2018 | Rostamabadi ...... H04L 63/0236 |
| 2006/0294311 | A1 | 12/2006 | Fu et al. |
| 2010/0228701 | A1 | 9/2010 | Harris, III et al. |
| 2011/0276744 | A1 | 11/2011 | Sengupta |
| 2013/0166576 | A1 | 6/2013 | Hudzia et al. |
| 2013/0179529 | A1 | 7/2013 | Khakpour |
| 2013/0227051 | A1 | 8/2013 | Khakpour et al. |
| 2017/0154099 | A1 | 6/2017 | Chen |
| 2018/0060071 | A1 | 3/2018 | Nassi et al. |

OTHER PUBLICATIONS

List of IBM Patents or Patent Applications Treated as Related, Filed Feb. 6, 2018, 2 pages.

Guo et al. "The Dynamic Bloom Filters" IEEE Transactions on Knowledge and Data Engineering, vol. , No. , 2009. pp. 1-15.

Wikipedia "Bloom Filters" Bender the Bot (talk | contribs) at 06:29, Nov. 27, 2016. <https://en.wikipedia.org/w/index.php?title=Bloom_filter&oldid=751679608>.

Yoon. "Aging Bloom Filter with Two Active Buffers for Dynamic Sets—IEEE Xplore Document". IEEE Transactions on Knowledge . . . > vol. 22 Issue: 1. pp. 2. Jan. 2010. pp. 134-138.

Mell et al. "The NIST Definition of Cloud Computing" Recommendations of the National Institute of Standards and Technology Publication 800-145. Sep. 2011. Gaitersburg, MD.

Appendix P List of IBM Patents or Applications Treated as Related. Dated Dec. 20, 2017. Two pages.

Bar-Joshua et al. Original U.S. Appl. No. 15/841,890, filed Dec. 14, 2017.

* cited by examiner

UPDATING CACHE USING TWO BLOOM FILTERS

BACKGROUND

The present disclosure relates to updating cache devices, and more specifically, but not exclusively, to updating cache devices using two Bloom filters.

A Bloom filter is a space-efficient probabilistic data structure that is used to test whether a particular element is a member of a set. False positive matches are possible, but false negatives are not, that is, a query returns either "possibly in set" or "definitely not in set."

An empty Bloom filter is a bit array of "m" bits set to "0." There must also be "k" different hash functions defined, each hash function hashes some set element to one of the "m" array positions, generating a uniform random distribution. Typically, "k" is a constant much smaller than "m," which is proportional to the number of elements to be added. The precise choice of "k" and the constant of proportionality of "m" are determined by the intended false positive rate of the filter.

SUMMARY

According to an aspect of the present invention, there is a method, computer program product and/or system that performs the following steps (not necessarily in the following order): (i) detecting a first set of hash functions and a first bit array corresponding to elements of a cache; (ii) detecting a first instruction to add a new element to the cache; (iii) modifying the first bit array based on the new element, wherein modifying the first bit array comprises modifying bit values corresponding to hash values generated from the first set of hash functions applied to the new element; (iv) processing a first invalidation operation using the first bit array; (v) generating a second bit array and a second set of hash functions, while processing additional instructions with the first bit array; (vi) deleting the first bit array and the first set of hash functions in response to detecting the second bit array and the second set of hash functions have been completely generated; and (vii) processing a second invalidation operation using the second set of hash functions and the second bit array.

According to an embodiment described herein, a system for managing cache can include a processor to detect a first set of hash functions and a first bit array corresponding to elements of a cache and detect a first instruction to add a new element to the cache. The processor can also modify the first bit array based on the new element, wherein modifying the first bit array comprises modifying bit values corresponding to hash values generated from the first set of hash functions applied to the new element. Additionally, the processor can process a first invalidation operation using the first bit array and generate a second bit array and a second set of hash functions while processing additional instructions with the first bit array. Furthermore, the processor can delete the first bit array and the first set of hash functions in response to detecting the second bit array and the second set of hash functions have been completely generated and process a second invalidation operation using the second set of hash functions and the second bit array.

According to another embodiment, a method for updating cache devices can include detecting a first set of hash functions and a first bit array corresponding to elements of a cache. The method can also include detecting a first instruction to add a new element to the cache and modifying the first bit array based on the new element, wherein modifying the first bit array comprises modifying bit values corresponding to hash values generated from the first set of hash functions applied to the new element. Additionally, the method can include processing a first invalidation operation using the first bit array and generating a second bit array and a second set of hash functions while processing additional instructions to add additional elements to the cache. Furthermore, the method can include deleting the first bit array and the first set of hash functions in response to detecting the second bit array and the second set of hash functions have been completely generated, and processing a second invalidation operation using the second set of hash functions and the second bit array.

According to another embodiment, a computer program product for updating cache devices using two Bloom filters can include a computer readable storage medium having program instructions embodied therewith, wherein the computer readable storage medium is not a transitory signal per se. The program instructions can be executable by a processor to cause the processor to detect a first set of hash functions and a first bit array corresponding to elements of a cache and detect a first instruction to add a new element to the cache. The program instructions can also be executable by a processor to cause the processor to modify the first bit array based on the new element, wherein modifying the first bit array comprises modifying bit values corresponding to hash values generated from the first set of hash functions applied to the new element. Additionally, the program instructions can be executable by a processor to cause the processor to process a first invalidation operation using the first bit array and generate a second bit array and a second set of hash functions while processing additional instructions to add additional elements to the cache. Furthermore, the program instructions can be executable by a processor to cause the processor to delete the first bit array and the first set of hash functions in response to detecting the second bit array and the second set of hash functions have been completely generated, and process a second invalidation operation using the second set of hash functions and the second bit array.

DETAILED DESCRIPTION

Dual Bloom filters are maintained, one active and another inactive, to achieve an efficient filter design. When a sweep of the data set is caused by a hit of the active filter, the inactive filter is rebuilt based on the data set.

Cache devices can execute invalidation operations. For example, cache devices can store data using virtual memory addresses that correspond to effective memory addresses in main memory devices. The data stored in the cache devices can be copies of data stored in the main memory devices, which can be loaded into the cache devices in response to a processor executing an instruction that involves the data. In some embodiments, the processor can detect if a copy of data is stored in cache before requesting the data from main memory. If the copy of data is stored in a cache device, the processor can load the data with a faster response time than requesting the data from a main memory device. However, copies of data can be removed from the cache devices. Accordingly, an invalidation operation may indicate that data stored in a cache device is no longer accessible. In some examples, the invalidation operation can also indicate that a virtual memory address requested by a processor does not translate to a memory range in a cache device, which indicates that the virtual memory address may be invalid.

In some embodiments described herein, a device can process invalidation operations using a filter. For example, a filter can indicate whether a virtual memory address referenced in an invalidation operation corresponds to a cache device. The filter can prevent a cache device from executing an unnecessary invalidation operation. In some embodiments, a device can filter invalidation operations by determining if a virtual memory address may reside in a cache device. For example, a device for updating cache systems can use two Bloom filters to process invalidation operations. For example, a device can detect a first set of hash functions and a first bit array corresponding to elements or virtual memory addresses of a cache and detect a first instruction to add or process a new element to the cache. The device can also modify the first bit array based on the new element, wherein modifying the first bit array comprises modifying bit values corresponding to hash values generated from the first set of hash functions applied to the new element. Furthermore, the device can process a first invalidation operation using the first bit array and generate a second bit array and a second set of hash functions while processing additional instructions to add additional elements to the cache and invalidate additional elements of the cache. The device can also delete the first bit array and the first set of hash functions in response to detecting the second bit array and the second set of hash functions have completely been generated. In some embodiments, the device can also process a second invalidation operation with the second bit array. Accordingly, the techniques described herein can prevent scanning a cache device for each invalidation operation.

Figure 1:
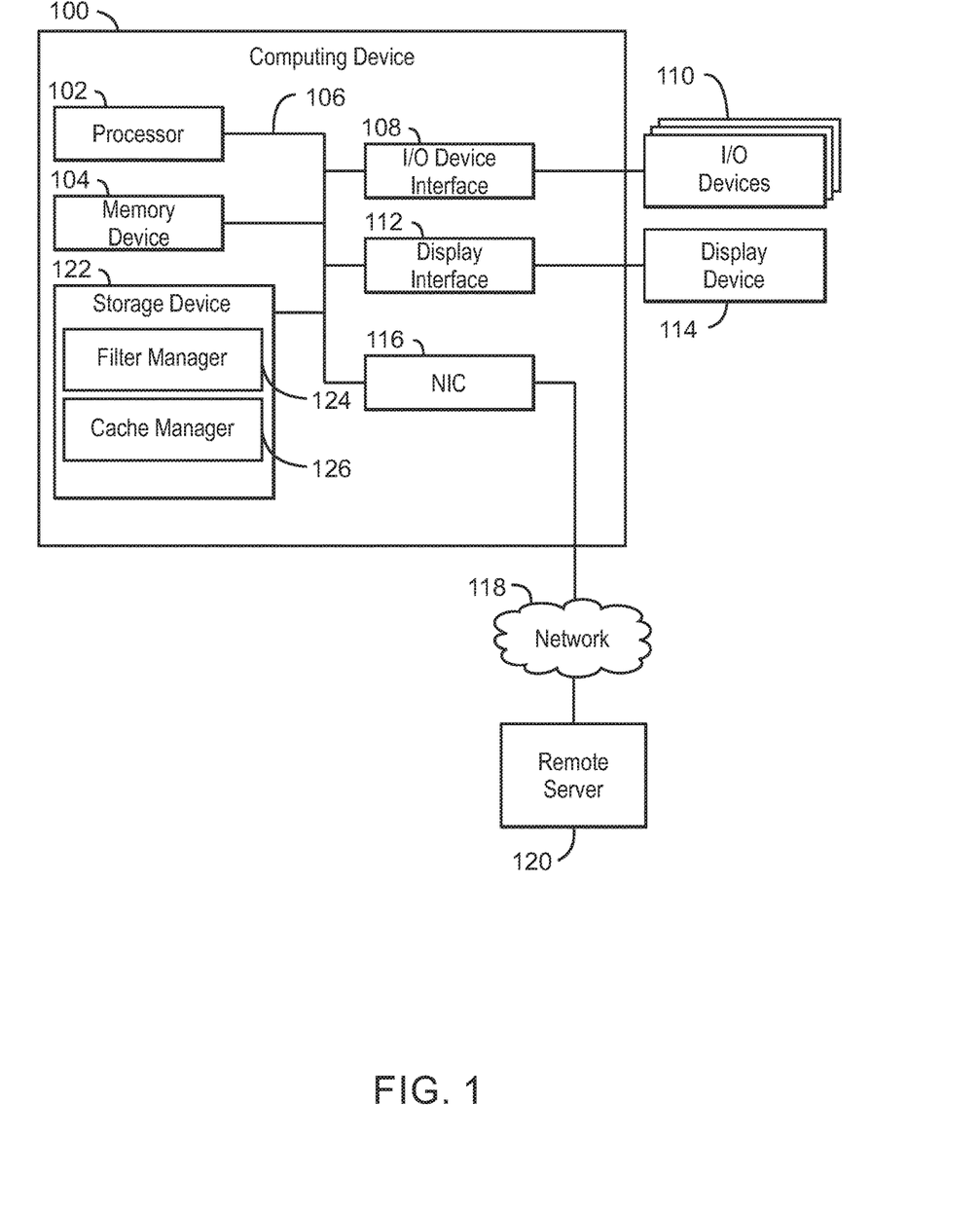
FIG. 1 depicts a block diagram of a first embodiment of a computing system to update a cache device using two Bloom filters according to the present invention.

With reference now to FIG. 1, an example computing device is depicted that can update a cache device using two Bloom filters. The computing device 100 may be for example, a server, desktop computer, laptop computer, tablet computer, or smartphone. In some examples, computing device 100 may be a cloud computing node. Computing device 100 may be described in the general context of computer system executable instructions, such as program modules, being executed by a computer system. Generally, program modules may include routines, programs, objects, components, logic, data structures, and so on that perform particular tasks or implement particular abstract data types. Computing device 100 may be practiced in distributed cloud computing environments where tasks are performed by remote processing devices that are linked through a communications network. In a distributed cloud computing environment, program modules may be located in both local and remote computer system storage media including memory storage devices.

The computing device 100 may include a processor 102 that is adapted to execute stored instructions, a memory device 104 to provide temporary memory space for operations of said instructions during operation. The processor can be a single-core processor, multi-core processor, computing cluster, or any number of other configurations. The memory 104 can include random access memory (RAM), read only memory, flash memory, or any other suitable memory systems.

The processor 102 may be connected through a system interconnect 106 (e.g., PCI®, PCI-Express®, etc.) to an input/output (I/O) device interface 108 adapted to connect the computing device 100 to one or more I/O devices 110. The I/O devices 110 may include, for example, a keyboard and a pointing device, wherein the pointing device may include a touchpad or a touchscreen, among others. The I/O devices 110 may be built-in components of the computing device 100, or may be devices that are externally connected to the computing device 100.

The processor 102 may also be linked through the system interconnect 106 to a display interface 112 adapted to connect the computing device 100 to a display device 114. The display device 114 may include a display screen that is a built-in component of the computing device 100. The display device 114 may also include a computer monitor, television, or projector, among others, that is externally connected to the computing device 100. In addition, a network interface controller (NIC) 116 may be adapted to connect the computing device 100 through the system interconnect 106 to the network 118. In some embodiments, the NIC 116 can transmit data using any suitable interface or protocol, such as the internet small computer system interface, among others. The network 118 may be a cellular network, a radio network, a wide area network (WAN), a local area network (LAN), or the Internet, among others. A remote server 120 may connect to the computing device 100 through the network 118.

The processor 102 may also be linked through the system interconnect 106 to a storage device 122 that can include a hard drive, an optical drive, a USB flash drive, an array of drives, or any combinations thereof. In some examples, the storage device 122 may include a filter manager 124, and a cache manager 126. In some embodiments, the filter manager 124 can detect a first set of hash functions and a first bit array corresponding to elements of a cache and detect a first instruction to add a new element to the cache. In some examples, the first bit array is a Bloom filter. The filter manager 124 can also modify the first bit array based on the new element, wherein modifying the first bit array comprises modifying bit values corresponding to hash values generated from the first set of hash functions applied to the new element. Furthermore, the filter manager 124 can process a first invalidation operation using the first bit array and generate a second bit array and a second set of hash functions while processing additional instructions with the first bit array and delete the first bit array and the first set of hash functions in response to detecting the second bit array and the second set of hash functions have been completely generated. In some embodiments, the cache manager 126 can process a second invalidation operation with the second set of hash functions and the second bit array. In some examples, the second bit array is a Bloom filter.

It is to be understood that the block diagram of FIG. 1 is not intended to indicate that the computing device 100 is to include all of the components shown in FIG. 1. Rather, the computing device 100 can include fewer or additional components not illustrated in FIG. 1 (e.g., additional memory components, embedded controllers, modules, additional network interfaces, etc.). Furthermore, any of the functionalities of the filter manager 124 and the cache manager 126 may be partially, or entirely, implemented in hardware and/or in the processor 102. For example, the functionality may be implemented with an application specific integrated circuit, logic implemented in an embedded controller, or in logic implemented in the processor 102, among others. In some embodiments, the functionalities of the filter manager 124 and the cache manager 126 can be implemented with logic, wherein the logic, as referred to herein, can include any suitable hardware (e.g., a processor, among others), software (e.g., an application, among others), firmware, or any suitable combination of hardware, software, and firmware.

Figure 2:
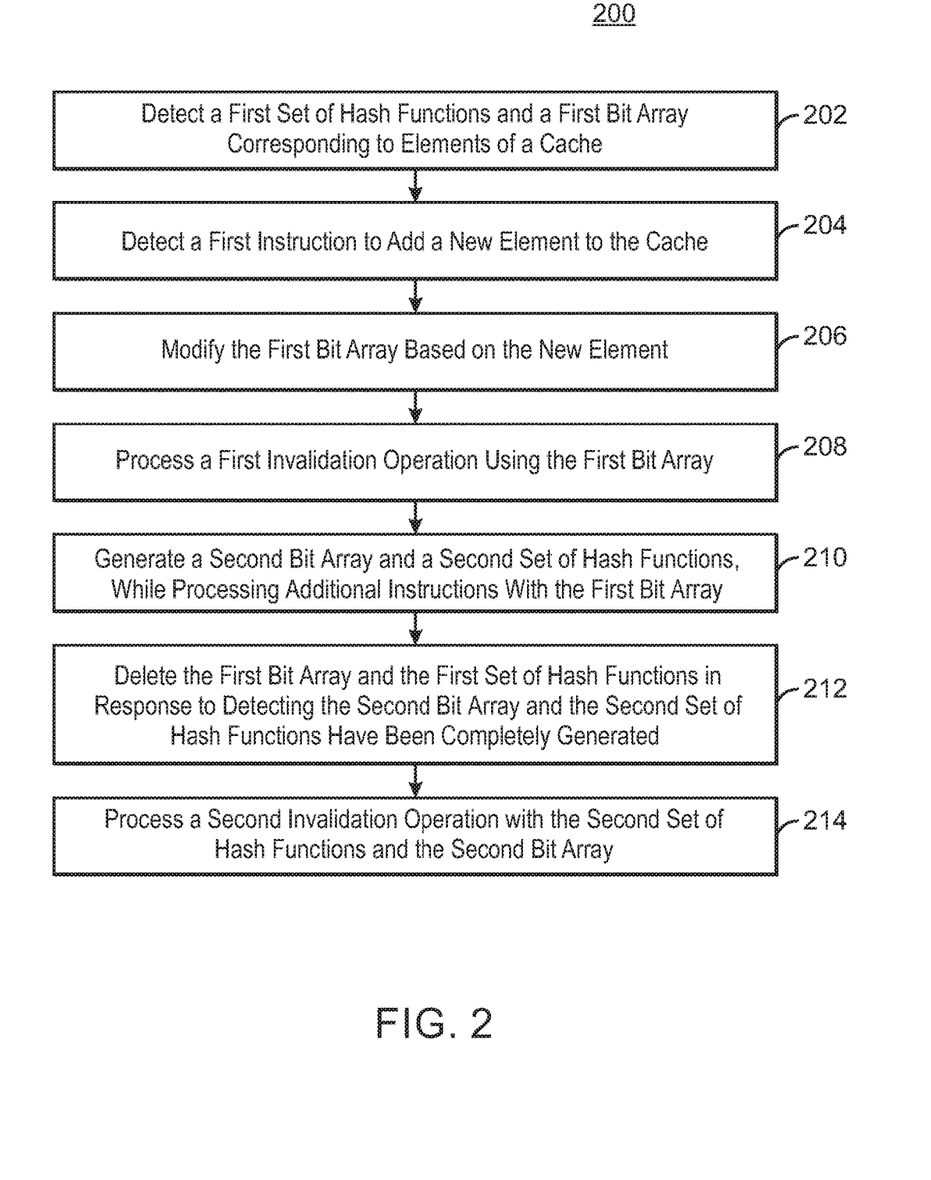
FIG. 2 is a process flow diagram showing a method performed, at least in part, by the first embodiment computing system.

FIG. 2 is a process flow diagram of an example method that can update a cache based on two Bloom filters. The method 200 can be implemented with any suitable computing device, such as the computing device 100 of FIG. 1.

At block 202, a filter manager 124 can detect a first set of hash functions and a first bit array corresponding to elements of a cache. In some examples, the first set of hash functions can include any number of hash functions based on hashing algorithms such as MD5, SHA-1, SHA-2, and SHA-3, among others. In some embodiments, the first bit array can be a Bloom filter that is initialized to a set of zero values and can include any suitable number of bits. In some examples, any number of the first set of hash functions can be used to set each bit of the first bit array. For example, the filter manager 124 can generate hash values for each element of the first bit array by applying each element of a set of data values to each of the hash functions. The result of each of the hash functions can be used to change bit values from zero to one. In some embodiments, each bit that has a one value can indicate that an element is either not in a set of elements mapped to the first bit array or is possibly in a set of elements mapped to the first bit array. In some examples, each element of a cache corresponds to a data value copied from a main memory device. The first set of hash functions and the first bit array can provide a filter for invalidation operations. For example, the first set of hash functions and the first bit array can indicate if a virtual memory address to effective or real memory address translation of a data value resides in a cache device.

At block 204, the filter manager 124 can detect a first instruction to add a new element to the cache. For example, the filter manager 124 can detect that a set mapped to the first bit array includes a new element. In some examples, the filter manager 124 can detect an instruction that adds a new virtual memory address to effective memory address translation to the first bit array. As discussed above, the first bit array can indicate whether a virtual memory address to effective memory address translation exists in a cache device.

At block 206, the filter manager 124 can modify the first bit array based on the new element, wherein modifying the first bit array comprises modifying bit values corresponding to hash values generated from the first set of hash functions applied to the new element. For example, the filter manager 124 can apply the new element to any number of the hash functions and modify bits of the first bit array based on the output values of the hash functions.

At block 208, the filter manager 124 can process a first invalidation operation using the first bit array. The filter manager 124 can process the first invalidation operation by determining if a memory address or memory address translation corresponding to the invalidation operation is stored in a cache device. For example, the filter manager 124 can use the first bit array to determine if a memory address or memory address translation associated with the invalidation operation may be processed by a cache device. In some examples, the memory address translation can correspond to a virtual memory address to an effective memory address translation. The invalidation operation can result in deleting memory addresses or memory address translations from a cache device, which can result in updating the first bit array by generating a second bit array in block 210 below. In some examples, the first bit array and the second bit array are Bloom filters, which can prohibit deleting elements or data values from the arrays.

At block 210, the filter manager 124 can generate a second bit array and a second set of hash functions, while processing additional instructions with the first bit array. The additional instructions can include instructions to add new elements or data values to the cache, instructions to update the first bit array based on the new elements, and instructions to process additional invalidation operations, among others. In some examples, the second set of hash functions differs from the first set of hash functions. In some embodiments, the filter manager 124 can designate the first bit array as an active array for invalidation operations or queries until a second bit array is generated, wherein the second bit array is also a Bloom array or Bloom filter. In some embodiments, the filter manager 124 can generate a second bit array each time an invalidation operation is processed using the first bit array. In some examples, the filter manager 124 can detect at least one element to remove from a set of elements mapped to the first bit array and prevent bits from being set in the second bit array based on the at least one element during the generation of the second bit array. In some embodiments, the deleted bits from the first bit array correspond to invalid virtual memory address to effective memory address translations.

At block 212, the filter manager 124 can delete the first bit array and the first set of hash functions in response to detecting the second bit array and the second set of hash functions have been generated. For example, the filter manager 124 can designate the second bit array as the active array and invalidation operations or cache queries can be performed based on the second bit array.

At block 214, a cache manager 126 can process a second invalidation operation using the second set of hash functions and the second bit array. In some embodiments, the cache comprises an address translation cache and the invalidation operations correspond to invalidated memory pages in which a virtual memory address does not exist for an actual memory address. In some examples, the cache manager 126 can alternate between designating the first bit array as the active array and the second bit array as the active array. For example, the cache manager 126 can maintain two Bloom filters or bit arrays that process invalidation operations.

In some examples, the cache manager 126 can use a first Bloom filter until an invalidation operation is processed using the first Bloom filter, then a second Bloom filter is generated and used until a second invalidation operation is processed. The cache manager 126 can then re-generate the first Bloom filter for processing a third invalidation operation and delete the second Bloom filter when the first Bloom filter is re-generated. Accordingly, the invalidation operations can result in the cache manager 126 re-generating one of the two Bloom filters and designating the newly generated Bloom filter as the active array to process the next subsequent invalidation operation.

The process flow diagram of FIG. 2 is not intended to indicate that the operations of the method 200 are to be executed in any particular order, or that all of the operations of the method 200 are to be included in every case. In some examples, prior to processing an invalidation operation, the filter manager 124 can detect and process any number of instructions to add new elements to a cache device, wherein the instructions result in modifying bits in the first bit array. The invalidation operations can include system commands that invalidate a translation from a virtual page to a real page such as translation look-aside buffer invalidate commands (TLBIs) or segment look-aide buffer invalidate commands (SLBIs).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical functions. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 3:
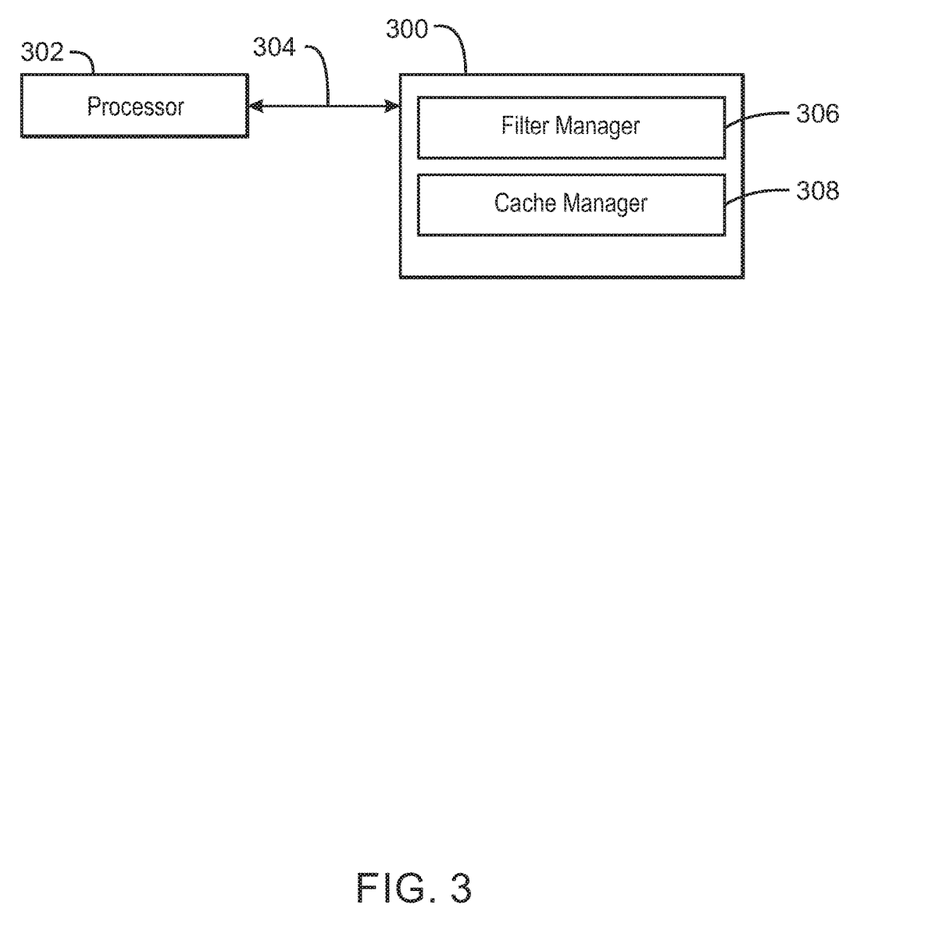
FIG. 3 is a first embodiment of a computer-readable storage medium that updates a cache device using two Bloom filters according to the present invention.

Referring now to FIG. 3, a block diagram is depicted of an example of a tangible, non-transitory computer-readable medium that can update cache devices. The tangible, non-transitory, computer-readable medium 300 may be accessed by a processor 302 over a computer interconnect 304.

Furthermore, the tangible, non-transitory, computer-readable medium 300 may include code to direct the processor 302 to perform the operations of the current method. For example, a filter manager 306 can detect a first set of hash functions and a first bit array corresponding to elements of a cache and detect a first instruction to add a new element to the cache. The filter manager 306 can also modify the first bit array based on the new element, wherein modifying the first bit array comprises modifying bit values corresponding to a hash value detected from the first set of hash functions applied to the new element. Furthermore, the filter manager 306 can process a first invalidation operation using the first bit array and generate a second bit array and a second set of hash functions, while processing additional instructions with the first bit array and delete the first bit array and the first set of hash functions in response to detecting the second bit array and the second set of hash functions have been generated. In some embodiments, a cache manager 308 can process a second invalidation operation using the second set of hash functions and the second bit array.

It is to be understood that any number of additional software components not shown in FIG. 3 may be included within the tangible, non-transitory, computer-readable medium 300, depending on the specific application. Furthermore, fewer software components than those shown in FIG. 3 can be included in the tangible, non-transitory, computer-readable medium 300.

Figure 4:
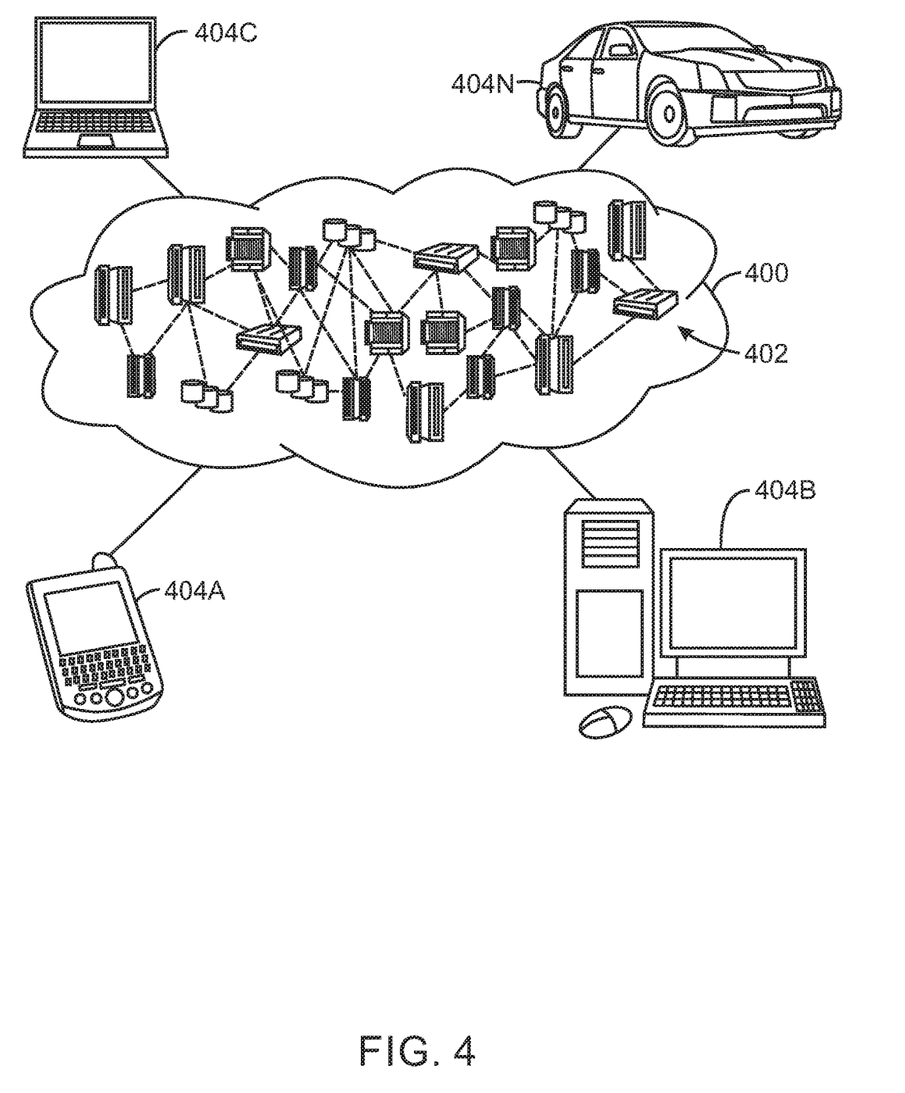
FIG. 4 depicts an illustrative cloud computing environment according to the present invention.

Referring now to FIG. 4, illustrative cloud computing environment 400 is depicted. As shown, cloud computing environment 400 comprises one or more cloud computing nodes 402 with which local computing devices used by cloud consumers, such as, for example, personal digital assistant (PDA) or cellular telephone 404A, desktop computer 404B, laptop computer 404C, and/or automobile computer system 404N may communicate. Nodes 402 may communicate with one another. They may be grouped (not shown) physically or virtually, in one or more networks, such as Private, Community, Public, or Hybrid clouds as described hereinabove, or a combination thereof. This allows cloud computing environment 400 to offer infrastructure, platforms and/or software as services for which a cloud consumer does not need to maintain resources on a local computing device. It is understood that the types of computing devices 404A-N shown in FIG. 4 are intended to be illustrative only and that computing nodes 402 and cloud computing environment 400 can communicate with any type of computerized device over any type of network and/or network addressable connection (e.g., using a web browser).

Figure 5:
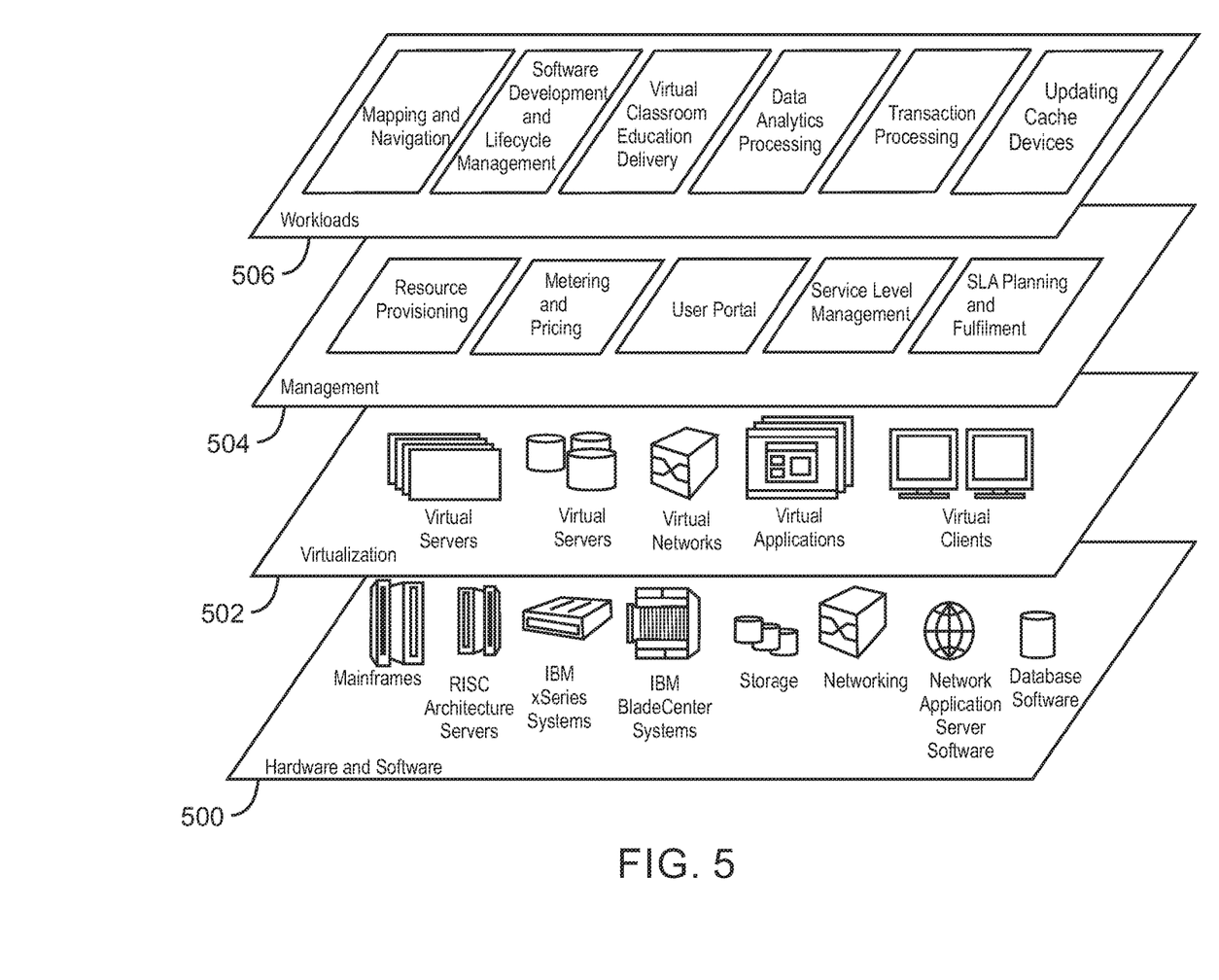
FIG. 5 depicts an illustrative set of functional abstraction layers provided by a cloud computing environment according to the present invention.

Referring now to FIG. 5, a set of functional abstraction layers provided by cloud computing environment 400 (FIG. 4) is shown. It should be understood in advance that the components, layers, and functions shown in FIG. 5 are intended to be illustrative only and embodiments of the invention are not limited thereto. As depicted, the following layers and corresponding functions are provided.

Hardware and software layer 500 includes hardware and software components. Examples of hardware components include mainframes; RISC (Reduced Instruction Set Computer) architecture based servers; storage devices; networks and networking components. Examples of software components include network application server software and database software.

Virtualization layer 502 provides an abstraction layer from which the following examples of virtual entities may be provided: virtual servers; virtual storage; virtual networks, including virtual private networks; virtual applications and operating systems; and virtual clients. In one example, management layer 504 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 506 provides examples of functionality for which the cloud computing environment may be utilized. Examples of workloads and functions which may be provided from this layer include: mapping and navigation; software development and lifecycle management; virtual classroom education delivery; data analytics processing; transaction processing; and updating cache devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Some helpful definitions follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

User/subscriber: includes, but is not necessarily limited to, the following: (i) a single individual human; (ii) an artificial intelligence entity with sufficient intelligence to act as a user or subscriber; and/or (iii) a group of related users or subscribers.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

What is claimed is:

1. A system for managing cache comprising:
a processor to:
detect a first set of hash functions and a first bit array corresponding to elements of a cache;
detect a first instruction to add a new element to the cache;
modify the first bit array based on the new element, wherein modifying the first bit array comprises modifying bit values corresponding to a hash value detected from the first set of hash functions applied to the new element;
process a first invalidation operation using the first bit array;
generate a second bit array and a second set of hash functions, while processing additional instructions with the first bit array;
delete the first bit array and the first set of hash functions in response to detecting the second bit array and the second set of hash functions have been generated; and
process a second invalidation operation using the second set of hash functions and the second bit array.

2. The system of claim 1, wherein the processor is to delete the second bit array and the second set of hash functions in response to processing the second invalidation operation with the second bit array.

3. The system of claim 1, wherein the first bit array and the second bit array are Bloom filters.

4. The system of claim 1, wherein the processor is to:
detect at least one element to remove from the first bit array; and
prevent bits from being set based on the at least one element during the generation of the second bit array.

5. The system of claim 1, wherein the processor is to designate the first bit array as an active array for invalidation operations until the second bit array is generated.

6. The system of claim 5, wherein the processor is to alternate between designating the first bit array as the active array and the second bit array as the active array.

7. The system of claim 1, wherein the second set of hash functions differs from the first set of hash functions.

8. The system of claim 1, wherein the cache comprises an address translation cache and the invalidation operations correspond to invalidated memory pages in which a virtual memory address does not exist for an actual memory address.

9. A computer program product comprising a computer readable storage medium having stored thereon:
first program instructions programmed to detect a first set of hash functions and a first bit array corresponding to elements of a cache;
second program instructions programmed to detect a first instruction to add a new element to the cache;
third program instructions programmed to modify the first bit array based on the new element, wherein modifying the first bit array comprises modifying bit values corresponding to a hash value detected from the first set of hash functions applied to the new element;
fourth program instructions programmed to process a first invalidation operation using the first bit array;
fifth program instructions programmed to generate a second bit array and a second set of hash functions, while processing additional instructions with the first bit array;
sixth program instructions programmed to delete the first bit array and the first set of hash functions in response to detecting the second bit array and the second set of hash functions have been generated; and
seventh program instructions programmed to process a second invalidation operation using the second set of hash functions and the second bit array.

10. The computer program product of claim 9 having further stored thereon:
eighth program instructions programmed to delete the second bit array and the second set of hash functions responsive to processing the second invalidation operation with the second bit array.

11. The computer program product of claim 9, wherein the first bit array and the second bit array are Bloom filters.

12. The computer program product of claim 9 having further stored thereon:
eighth program instructions programmed to detect at least one element to remove from the first bit array; and
ninth program instructions programmed to prevent bits from being set based on the at least one element during the generation of the second bit array.

13. The computer program product of claim 9, wherein the processor is to designate the first bit array as an active array for invalidation operations until the second bit array is generated.

14. The computer program product of claim 13, wherein the processor is to alternate between designating the first bit array as the active array and the second bit array as the active array.

15. The computer program product of claim 9, wherein the second set of hash functions differs from the first set of hash functions.

16. The computer program product of claim 9, wherein the cache comprises an address translation cache and the invalidation operations correspond to invalidated memory pages in which a virtual memory address does not exist for an actual memory address.

* * * * *